US011042432B1

(12) United States Patent
Rao et al.

(10) Patent No.: US 11,042,432 B1
(45) Date of Patent: Jun. 22, 2021

(54) DATA STORAGE DEVICE WITH DYNAMIC STRIPE LENGTH MANAGER

(71) Applicant: Western Digital Technologies, Inc., San Jose, CA (US)

(72) Inventors: Abhijit Rao, Bangalore (IN); Ramanathan Muthiah, Bangalore (IN); Judah Gamliel Hahn, Ofra (IL); Gautam Ashok Dusija, Burlingame, CA (US); Daniel Linnen, Naperville, IL (US)

(73) Assignee: Western Digital Technologies, Inc., San Jose, CA (US)

( * ) Notice: Subject to any disclaimer, the term of this patent is extended or adjusted under 35 U.S.C. 154(b) by 32 days.

(21) Appl. No.: 16/723,513

(22) Filed: Dec. 20, 2019

(51) Int. Cl.
*G06F 11/00* (2006.01)
*G06F 11/07* (2006.01)
*G06F 11/10* (2006.01)
*G11C 11/408* (2006.01)
*G06F 9/50* (2006.01)
*G06F 12/02* (2006.01)
*G06F 12/0882* (2016.01)
*G06F 11/30* (2006.01)

(52) U.S. Cl.
CPC .......... *G06F 11/076* (2013.01); *G06F 9/5016* (2013.01); *G06F 11/0772* (2013.01); *G06F 11/1044* (2013.01); *G06F 11/3037* (2013.01); *G06F 12/0246* (2013.01); *G06F 12/0882* (2013.01); *G11C 11/4085* (2013.01)

(58) Field of Classification Search
CPC ............... G06F 11/076; G06F 11/0072; G06F 11/1044; G06F 11/3037; G06F 12/0246; G06F 12/0882; G06F 9/5016
See application file for complete search history.

(56) References Cited

U.S. PATENT DOCUMENTS

| 7,894,253 B2 | 2/2011 | Kreupl et al. |
| 8,130,575 B2 | 3/2012 | Hanzawa et al. |
| 8,264,895 B2 | 9/2012 | Rao |
| 8,373,150 B2 | 2/2013 | Schricker et al. |
| 8,737,111 B2 | 5/2014 | Kreupl et al. |

(Continued)

OTHER PUBLICATIONS

International Search Report and Written Opinion for Application No. PCT/US2020/035219 dated Aug. 19, 2020 (9 pages).

*Primary Examiner* — Christine T. Tu
(74) *Attorney, Agent, or Firm* — Michael Best & Friedrich LLP

(57) ABSTRACT

A memory controller includes, in one embodiment, a memory interface and a dynamic stripe length manager circuit configured to receive a first weighted health factor associated with a first memory block of the memory, determine a first collective stripe length of the first memory block based on the first weighted health factor, set a first number of zones in the first memory block based on the first collective stripe length, monitor the memory to detect a trigger event that triggers a calculation of a second collective stripe length of the first memory block, the second collective stripe length being larger than the first collective stripe length, receive a second weighted health factor associated with the first memory block, determine the second collective stripe length based on the second weighted health factor, and set a second number of zones in the first memory block based on the second collective stripe length.

20 Claims, 6 Drawing Sheets

(56) References Cited

U.S. PATENT DOCUMENTS

| | | | |
|---|---|---|---|
| 9,037,921 B1* | 5/2015 | Brooker | G06F 11/008 |
| | | | 714/47.1 |
| 2003/0037299 A1 | 2/2003 | Smith | |
| 2007/0228354 A1 | 10/2007 | Scheuerlein | |
| 2008/0072120 A1 | 3/2008 | Radke | |
| 2008/0222490 A1 | 9/2008 | Leung et al. | |
| 2008/0278989 A1 | 11/2008 | Lee et al. | |
| 2009/0006886 A1 | 1/2009 | O'Connor et al. | |
| 2009/0070651 A1 | 3/2009 | Diggs et al. | |
| 2009/0227067 A1 | 9/2009 | Kumar et al. | |
| 2009/0302315 A1 | 12/2009 | Lee et al. | |
| 2010/0038791 A1 | 2/2010 | Lee et al. | |
| 2010/0058119 A1 | 3/2010 | Reid | |
| 2010/0176365 A1 | 7/2010 | Park et al. | |
| 2010/0258782 A1 | 10/2010 | Kuse et al. | |
| 2010/0269000 A1 | 10/2010 | Lee | |
| 2011/0060968 A1 | 3/2011 | Warren | |
| 2014/0157065 A1 | 6/2014 | Ong | |
| 2014/0164685 A1 | 6/2014 | Kwak | |
| 2014/0195726 A1 | 7/2014 | Lee | |
| 2014/0359400 A1* | 12/2014 | Avila | G06F 12/0246 |
| | | | 714/773 |
| 2015/0178191 A1 | 6/2015 | Camp et al. | |
| 2016/0085612 A1 | 3/2016 | Liu | |
| 2016/0092120 A1 | 3/2016 | Liu | |
| 2016/0141029 A1 | 5/2016 | Navon et al. | |
| 2017/0371742 A1* | 12/2017 | Shim | G11C 16/349 |
| 2020/0341840 A1* | 10/2020 | Chang | G06F 13/1668 |

* cited by examiner

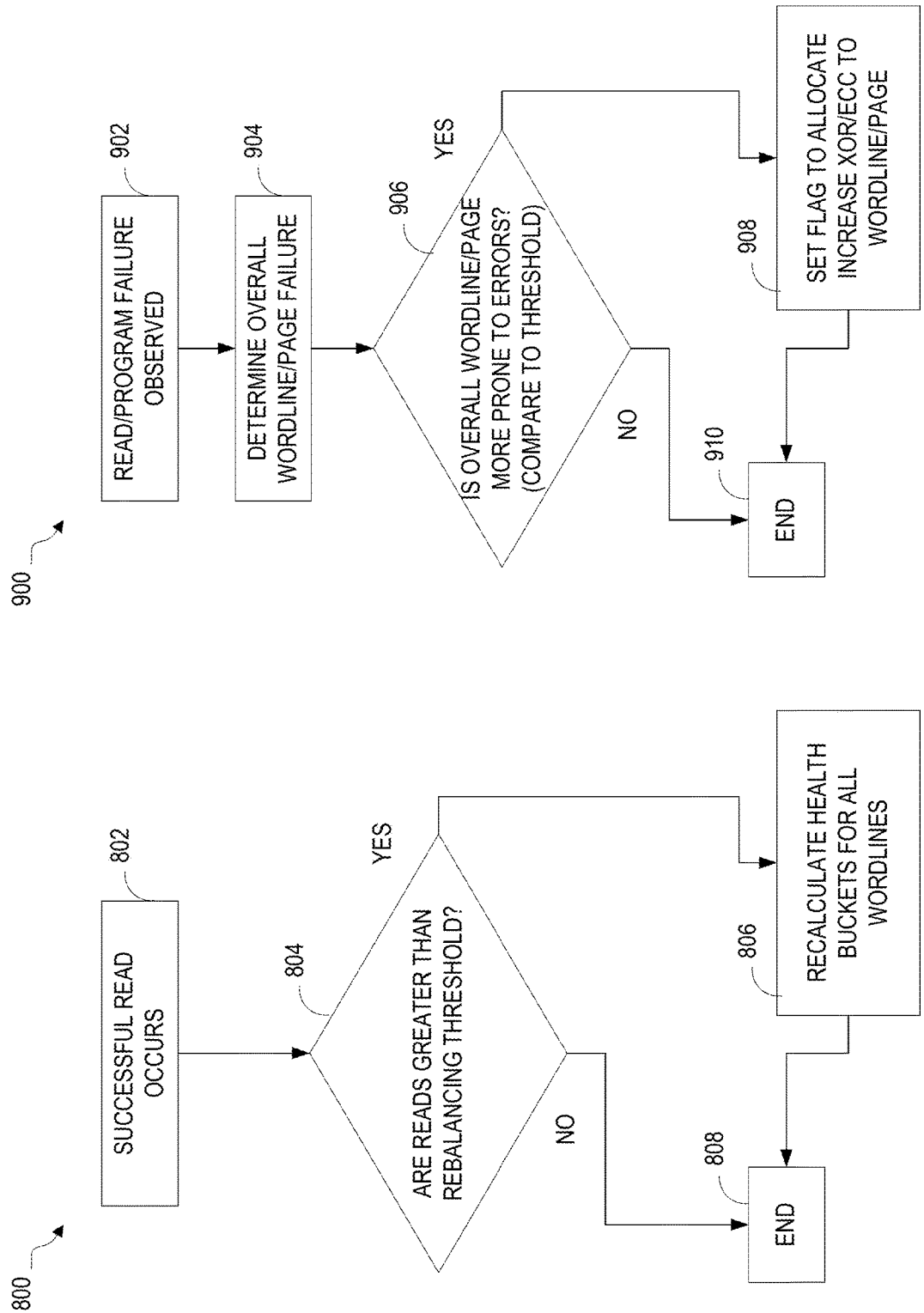

DATA STORAGE DEVICE WITH DYNAMIC STRIPE LENGTH MANAGER

BACKGROUND

This application relates generally to a controller, such as a memory controller. More specifically, this application relates to a memory controller with a dynamic stripe length manager.

Over the lifetime of NAND, changes in the media may have impacts on reads due to various mechanisms. For example, intrinsic raw bit error rate (RBER) increases may result in longer read times, due to the probabilistic nature of low-density parity check (LDPC), that can impact read recovery time. Additionally, extrinsic defects may vary in physical susceptibility over time, in ways that can impact reliability and quality of service.

SUMMARY

Previous conventional approaches have utilized a "one size fits all" approach to stripe size allocation. The present disclosure includes devices, systems, and methods to dynamically place the data on the NAND in stripes that vary in length and ECC in accordance with a health status and a host protection level or in accordance with observed and known bit error rate/defect patterns.

For example, one solution of the present disclosure is to increase or decrease zones in a block based on upon a health status of the block. In this example, the increase or decrease in zones may also be based upon the host protection level provided by the host.

Another solution of the present disclosure is to make a shorter stripe to facilitate faster recovery on physical locations where the bit error rates are determined to be susceptible to slower XOR/LDPC recovery. Yet another solution of the present disclosure is to make stripes that contain less user data, but have stronger error correction, to avoid XOR recovery due to RBER, but also to have faster read times in instances of XOR recovery.

Another solution is to decrease XOR stripes on physical locations that have greater susceptibility to extrinsic defects and increase stripe lengths on physical locations that have lesser susceptibility to extrinsic defects and execute this decrease/increase dynamically over time to mitigate known product risks (around early life and end of life behavior) and issues that come up in the field (around observed wordline failures). Finally, another solution is to dynamically select the XOR stripe scheme and include a mixture of observed good locations in with observed problem observed. The dynamic selection scheme may be assigned via a grading system from the garbage collection of the location prior to use.

With respect to health status and the host protection level, it may not be required to maintain multiple XOR zones for all blocks in the system as some of the blocks are of good health and some are weak. Weak blocks may require a larger stripe length ratio in comparison to strong blocks.

For very bad memories, where host capacity may be managed via large spare block count, but data protection is an absolute must, dynamic stripe length helps to ensure uniform recovery time for every block and also helps to ensure data recovery at the desired host protection level.

Dynamic stripe length of the present disclosure offers data protection without compromising on host timings. The dynamic stripe length may be implemented in firmware with XOR parity generation support in an LDPC engine.

The disclosure provides a memory controller including, in one embodiment, a memory interface configured to interface with a memory and a dynamic stripe length manager circuit. The dynamic stripe length manager circuit is configured to receive a first weighted health factor associated with a first memory block of the memory, determine a first collective stripe length of the first memory block based on the first weighted health factor, set a first number of zones in the first memory block based on the first collective stripe length, monitor the memory to detect a trigger event that triggers a calculation of a second collective stripe length of the first memory block, the second collective stripe length being larger than the first collective stripe length, receive a second weighted health factor associated with the first memory block, determine the second collective stripe length based on the second weighted health factor, and set a second number of zones in the first memory block based on the second collective stripe length.

The disclosure also provides a method. In one embodiment, the method includes receiving, with the dynamic stripe length manager circuit, a first weighted health factor associated with a first memory block of a memory. The method includes determining, with the dynamic stripe length manager circuit, a first collective stripe length of the first memory block based on the first weighted health factor. The method includes setting, with the dynamic stripe length manager circuit, a first number of zones in the first memory block based on the first collective stripe length. The method includes monitoring, with the dynamic stripe length manager circuit, the memory to detect a trigger event that triggers a calculation of a second collective stripe length of the first memory block, the second collective stripe length being larger than the first collective stripe length. The method includes receiving, with the dynamic stripe length manager circuit, a second weighted health factor associated with the first memory block. The method includes determining, with the dynamic stripe length manager circuit, the second collective stripe length based on the second weighted health factor. The method also includes setting, with the dynamic stripe length manager circuit, a second number of zones in the first memory block based on the second collective stripe length.

The disclosure also provides an apparatus including, in one embodiment, means for interfacing with and controlling a memory, means for receiving a first weighted health factor associated with a first memory block of the memory, means for determining a first collective stripe length of the first memory block based on the first weighted health factor, means for setting a first number of zones in the first memory block based on the first collective stripe length, means for monitoring the memory to detect a trigger event that triggers a calculation of a second collective stripe length of the first memory block, the second collective stripe length being larger than the first collective stripe length, means for receiving a second weighted health factor associated with the first memory block, means for determining the second collective stripe length based on the second weighted health factor, and means for setting a second number of zones in the first memory block based on the second collective stripe length.

In this manner, various aspects of the disclosure provide for improvements in at least the technical fields of memory devices and their design and architecture. The disclosure can be embodied in various forms, including hardware or circuits controlled by computer-implemented methods, computer program products, computer systems and networks, user interfaces, and application programming interfaces; as well as hardware-implemented methods, signal processing circuits, memory arrays, application specific integrated circuits, field programmable gate arrays, and the like. The foregoing summary is intended solely to give a general idea of various aspects of the disclosure, and does not limit the scope of the disclosure in any way.

BRIEF DESCRIPTION OF THE DRAWINGS

FIG. 8 is a flowchart illustrating another exemplary process for managing the dynamic stripe length, in accordance with some embodiments of the disclosure.

FIG. 9 is a flowchart illustrating another exemplary process for managing the dynamic stripe length, in accordance with some embodiments of the disclosure.

DETAILED DESCRIPTION

In the following description, numerous details are set forth, such as data storage device configurations, controller operations, and the like, in order to provide an understanding of one or more aspects of the present disclosure. It will be readily apparent to one skilled in the art that these specific details are merely exemplary and not intended to limit the scope of this application. In particular, the functions associated with the dynamic stripe length manager may be performed by hardware (e.g., analog or digital circuits), a combination of hardware and software (e.g., a non-transitory computer-readable medium and an electronic processor), or any other suitable means. The following description is intended solely to give a general idea of various aspects of the disclosure, and does not limit the scope of the disclosure in any way.

Figure 1:
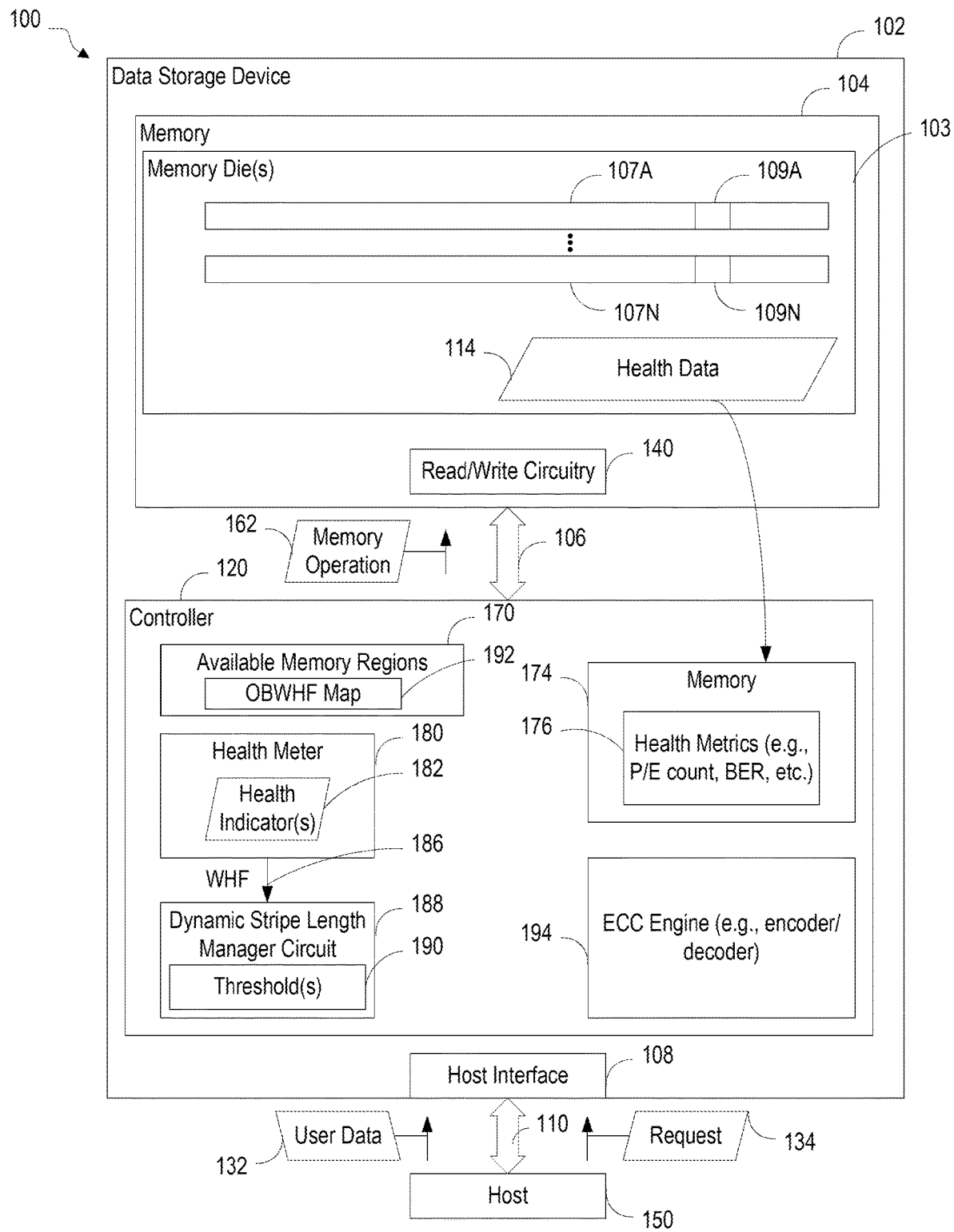
FIG. 1 is block diagram of a system including a data storage device that has a memory storing data corresponding to a dynamic stripe length, in accordance with some embodiments of the disclosure.

FIG. 1 is block diagram of a system 100 including a data storage device 102 that has a memory 104 storing data corresponding to a dynamic stripe length, in accordance with some embodiments. In the example of FIG. 1, the system 100 includes a data storage device 102 and a host device 150. The data storage device 102 includes a controller 120 and a memory 104 (e.g., non-volatile memory) that is coupled to the controller 120.

The controller 120 may be configured to use health data 114 associated with the memory 104 to determine one or more health statuses (e.g., one or more health indicators) associated with the memory 204. The health data 114 may include or correspond to reliability data associated with a characteristic of a storage element of the memory 104 (e.g., BiCS memory, NAND memory, or other suitable memory). For example, the health data 114 may indicate that a particular storage element of the memory 104 has a particular status of multiple health statuses and/or may include one or more parameters (e.g., the parameter data 122 of FIG. 1) associated with the particular storage element. The controller 120 may use the health data 114 (e.g., the reliability data) to perform one or more memory operations, as described further herein.

The data storage device 202 and the host device 250 may be operationally coupled via a connection (e.g., a communication path 110), such as a bus or a wireless connection. In some examples, the data storage device 102 may be embedded within the host device 150. Alternatively, in other examples, the data storage device 102 may be removable from the host device 150 (i.e., "removably" coupled to the host device 150). As an example, the data storage device 102 may be removably coupled to the host device 150 in accordance with a removable universal serial bus (USB) configuration. In some implementations, the data storage device 102 may include or correspond to a solid state drive (SSD), which may be used as an embedded storage drive (e.g., a mobile embedded storage drive), an enterprise storage drive (ESD), a client storage device, or a cloud storage drive, or other suitable storage drives.

The data storage device 102 may be configured to be coupled to the host device 150 via the communication path 110, such as a wired communication path and/or a wireless communication path. For example, the data storage device 102 may include an interface 108 (e.g., a host interface) that enables communication via the communication path 110 between the data storage device 202 and the host device 150, such as when the interface 208 is communicatively coupled to the host device 150.

The host device 150 may include a processor and a memory. The memory may be configured to store data and/or instructions that may be executable by the processor. The memory may be a single memory or may include one or more memories, such as one or more non-volatile memories, one or more volatile memories, or a combination thereof. The host device 150 may issue one or more commands to the data storage device 102, such as one or more requests to erase data at, read data from, or write data to the memory 104 of the data storage device 102. For example, the host device 150 may be configured to provide data, such as user data 132, to be stored at the memory 104 or to request data to be read from the memory 104. The host device 150 may include a mobile smartphone, a music player, a video player, a gaming console, an electronic book reader, a personal digital assistant (PDA), a computer, such as a laptop computer or notebook computer, any combination thereof, or other suitable electronic device.

The host device 150 communicates via a memory interface that enables reading from the memory 104 and writing to the memory 104. In some examples, the host device 150 may operate in compliance with an industry specification, such as a Universal Flash Storage (UFS) Host Controller Interface specification. In other examples, the host device 150 may operate in compliance with one or more other specifications, such as a Secure Digital (SD) Host Controller specification or other suitable industry specification. The host device 150 may also communicate with the memory 104 in accordance with any other suitable communication protocol.

The memory 104 of the data storage device 102 may include a non-volatile memory (e.g., NOR, NAND, PCM, MRAM, 3-D XPoint, DRAM, BiCS family of memories, or other suitable memory). In some examples, the memory 104 may be any type of flash memory. For example, the memory 104 may be two-dimensional (2D) memory or three-dimensional (3D) flash memory. The memory 104 may include one or more memory dies 103. Each of the one or more memory dies 103 may include one or more blocks (e.g., one or more erase blocks). Each block may include one or more groups of storage elements, such as a representative group of storage elements 107A-107N. The group of storage elements 107A-107N may be configured as a page or a word line. The group of storage elements 107 may include multiple storage elements (e.g., memory cells), such as a representative storage elements 109A and 109N, respectively.

The memory 104 may also include (e.g., store) the health data 114. The health data 114 may include or correspond to the reliability data 128 of FIG. 1. The health data 114 may be associated with a characteristic of a storage element of the memory 104. For example, the health data 114 may indicate a health (e.g., a reliability) of a particular storage element, a region of the memory 104 that includes the particular storage element, a neighboring storage element of the particular storage element, a region of the memory 104 that includes the neighboring storage element, or a combination thereof.

The memory 104 may include support circuitry, such as read/write circuitry 140, to support operation of the one or more memory dies 103. Although depicted as a single component, the read/write circuitry 140 may be divided into separate components of the memory 104, such as read circuitry and write circuitry. The read/write circuitry 140 may be external to the one or more memory dies 103 of the memory 104. Alternatively, one or more individual memory dies may include corresponding read/write circuitry that is operable to read from and/or write to storage elements within the individual memory die independent of any other read and/or write operations at any of the other memory dies.

The data storage device 102 includes the controller 120 coupled to the memory 104 (e.g., the one or more memory dies 103) via a bus 106, an interface (e.g., interface circuitry), another structure, or a combination thereof. For example, the bus 106 may include multiple distinct channels to enable the controller 120 to communicate with each of the one or more memory dies 103 in parallel with, and independently of, communication with the other memory dies 103. In some implementations, the memory 104 may be a flash memory.

The controller 120 is configured to receive data and instructions from the host device 150 and to send data to the host device 150. For example, the controller 120 may send data to the host device 150 via the interface 108, and the controller 120 may receive data from the host device 150 via the interface 108. The controller 120 is configured to send data and commands to the memory 104 and to receive data from the memory 104. For example, the controller 120 is configured to send data and a write command to cause the memory 104 to store data to a specified address of the memory 104. The write command may specify a physical address of a portion of the memory 104 (e.g., a physical address of a word line of the memory 104) that is to store the data. The controller 120 may also be configured to send data and commands to the memory 114 associated with background scanning operations, garbage collection operations, and/or wear-leveling operations, or other suitable memory health operations. The controller 120 is configured to send a read command to the memory 104 to access data from a specified address of the memory 104. The read command may specify the physical address of a region of the memory 104 (e.g., a physical address of a word line of the memory 104).

The controller 120 may include available memory regions 170, a memory 174, a health meter 180, a dynamic stripe length manager circuit 188, and an error correction code (ECC) engine 194. The available memory regions 170 may indicate a pool of free regions of the memory 104, such as one or more regions available to store data as part of a write operation. For example, the available memory regions 170 may be organized as a table or other data structure that is configured to track free regions of the memory 104 that are available for write operations. The memory 174 may include one or more metrics 176 associated with use of the memory 104. The metrics 176 may be tracked on a storage element-by-storage element basis, on a wordline-by-wordline basis, on a block-by-block basis, on a die-by-die basis, or other suitable basis. The one or more metrics 176 may track a program/erase (P/E) count (PEC), a bit error rate (BER), a programming time, an erase time, a number of voltage pulses to program a storage element, a number of voltage pulses to erase a storage element, a combination thereof, or other suitable metrics corresponding to the memory 104. In some implementations, the health data 114 or a copy thereof may be stored at the memory 174.

The health meter 180 may be configured to determine a health indicator 182 (e.g., one or more health indicators) associated with the memory 104. For example, the health meter 180 may apply a health scheme to one or more of the metrics 176, to the health data 114, or a combination thereof, to generate the health indicators 182.

The health indicators 182 may be stored at the health meter 180, at the memory 174, at the memory 104, or a combination thereof. In some implementations, the health meter 180 may be configured to provide a weight health factor 186 (e.g., a weighted health factor associated with each block) to the dynamic stripe length manager circuit 188. The health meter 180 may generate the weighted health factor 186 based on the health data 114, the metrics 176, the health indicators 182, or a combination thereof. The weighted health factor 186 may indicate a reliability of a storage element of the memory 104. In some examples, the weighted health factor 186 is defined by the following expression.

$$\text{Weighted Health Factor} = fx(\text{Decode Level}, \text{TimeConsumedbyECC}) \quad \text{Equation (1):}$$

In the above expression, the weighted health factor 186 is a factor based on the decode level and time consumed for decode of the particular block by the ECC engine 194. The weighted health factor 186 may also be sorted and maintained in a weighted health factor table, where the weighted health factor table includes a weighted health factor 186 associated with each block in the memory 104.

The dynamic stripe length manager circuit 188 may receive the weighted health factor 186 associated with each block of the memory 104. The dynamic stripe length manager circuit 188 may determine a health category for each block by comparing the weighted health factor 186 to one or more thresholds in a look-up table 190. For example, the dynamic stripe length manager 188 may compare a first weighted health factor 186 associated with a first block of the memory 104 to two thresholds in the look-up table 190 to determine the health category associated with the first block.

Figure 2:
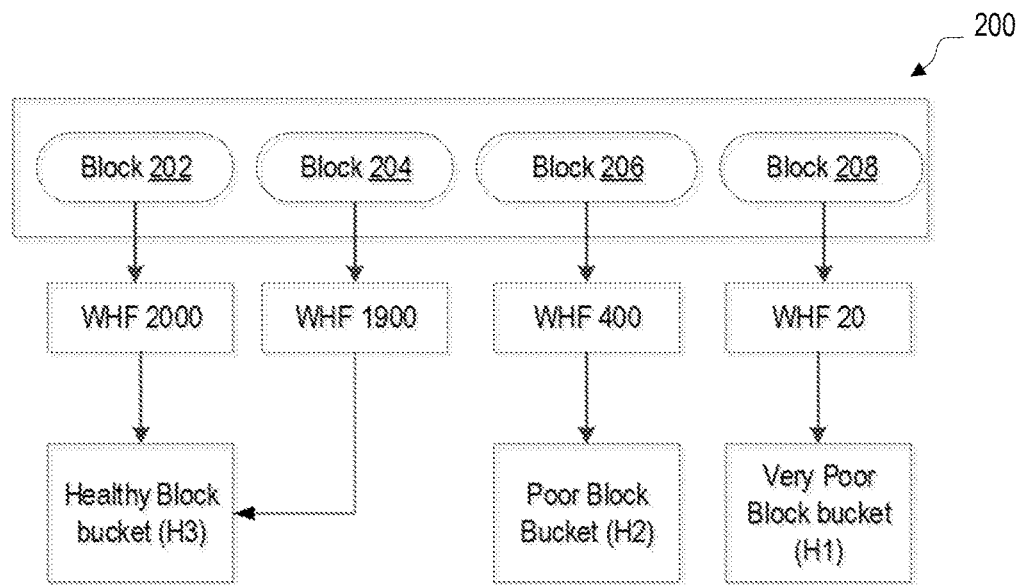
FIG. 2 is block diagram illustrating a classification of a health category for four different blocks, in accordance with some embodiments of the disclosure.

FIG. 2 is block diagram illustrating a classification 200 of a health category for four different blocks 202-208. When the first weighted health factor 186 (for example, "20" for block 208 as illustrated in FIG. 2) is below a first threshold (for example, "100"), the dynamic stripe length manager circuit 188 classifies the first block (e.g., block 208) as being in the "Very Poor Block" bucket (H1). When the first weighted health factor 186 (for example, "400" for block 206 as illustrated in FIG. 2) is above the first threshold and below a second threshold (for example, "1000"), the dynamic stripe length manager circuit 188 classifies a second block (e.g., block 206) as being in the "Poor Block" bucket (H2). When the first weighted health factor 186 (for example, "2000" or "1900" for blocks 202 and 204, respectively, as illustrated in FIG. 2) is above the first threshold and above the second threshold, the dynamic stripe length manager circuit 188 classifies a third block (e.g., block 202) and a fourth block (e.g., block 204) as being in the "Healthy Block" bucket (H3). In some examples, these classification may be maintained and stored in the dynamic stripe length manager circuit 188. In other examples, these classifications may be maintained the dynamic stripe length manager circuit 188 and stored as an open block weighted health factor map in the available memory regions 170 as described in greater detail below. Alternatively, in some examples, these classifications may be maintained the health meter 180 and stored as an open block weighted health factor map in the available memory regions 170.

A stripe length of a block determines the number of word lines that can be recovered in the event of write failure using XOR parity. Typically, XOR calculation happens for every 16 KB of host data (page size), and depending on the number of WL to be protected, the XOR parity size is decided. For example, a SLC block of size 128 GB and XOR parity with requirement to protect any 2 WL may use a 256 KB parity whereas for a TLC block of size 384 MB, the parity size may be 768 KB.

The stripe length of a block is the amount of data required for recovering data in the block. The stripe length for storing XOR data for a block may be calculated with the following expression.

$$\text{Stripe Length: Number of zones} * \text{Stripe length per zone} \quad \text{Equation (2):}$$

For example, in a generic stripe length calculation, the XOR stripe is further divided into bins, and every host page written corresponds to a particular bin. At any point in time, only one page per bin may be recovered. More than one page recovery per bin will require greater number of zones in the same block, thus increasing the stripe length. Put simply, a blanket (i.e., a non-dynamic) decision on increasing stripe lengths for blocks in the memory 104 regardless of health is feasible, but over time may impact overall user capacity. To prevent the impact on user capacity, a dynamic stripe length described below may be used instead of just increasing stripe lengths over time. However, in some examples, the dynamic stripe length manager circuit 188 may use a combination of non-dynamic and dynamic stripe lengths over time to minimize the impact on user capacity while also minimizing the amount of determinations required the dynamic stripe length manager circuit 188. For example, the dynamic stripe length manager circuit 188 may alternate between non-dynamic and dynamic stripe length increases over time or any other suitable combination of non-dynamic and dynamic stripe length increases.

The dynamic stripe length manager circuit 188 dynamically determines a stripe length based on the bucket in which a particular block is classified (e.g., bucket H1, bucket H2, or bucket H3 as illustrated in FIG. 2) and the host level protection requirement from the host 150. Initially, all blocks in the memory 104 start as healthy blocks (e.g., classified in the bucket H3). However, over a period of time, as a block encounters read failure, writes failure, or read soft modes, the block becomes less reliable and its health level decreases to a level that is lower than a level of a "healthy" block.

Figure 3:
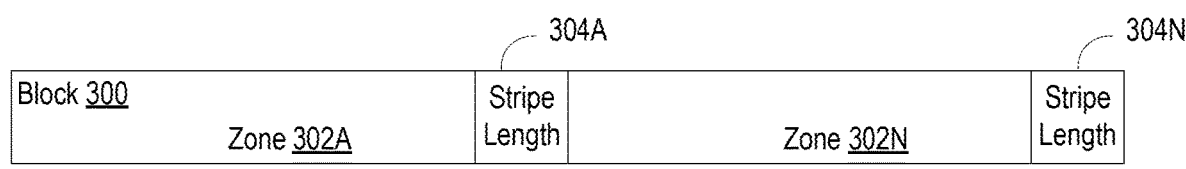
FIG. 3 is a block diagram illustrating an example healthy block with N zones, in accordance with some embodiments of the disclosure.

The dynamic stripe length manager circuit 188 may set blocks with good health (e.g., classified in bucket H3) to have a stripe length of N, where N is a number of zones*stripe length per zone. FIG. 3 is a block diagram illustrating an example healthy block 300 with N zones, in accordance with some embodiments of the disclosure. As illustrated in FIG. 3, N is equal to two, and the healthy block 300 includes a first zone 302A and a second zone 302N for host data. The first zone 302A includes a first stripe length 304A for XOR parity data associated with the first zone 302A and the second zone 302N includes a second stripe length 304N for XOR parity data associated with the second zone 302N. In some examples, the first stripe length 304A and the second stripe length 304N are each 256 kilobytes (KB) in length. In these examples, the healthy block 300 has a total of 512 KB in total stripe length (i.e., a "first collective stripe length").

Figure 4:
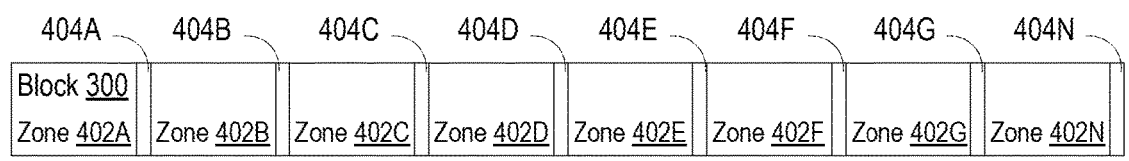
FIG. 4 is a block diagram illustrating an example poor block with N*4 zones, in accordance with some embodiments of the disclosure.

The dynamic stripe length manager 188 may set blocks with poor health (e.g., classified in bucket H2) to have stripe length of N*4, where 4 is a multiplication of the number of zones by four. FIG. 4 is a block diagram illustrating an example poor block 400 with N zones, in accordance with some embodiments of the disclosure. The poor block 400 is an example of the healthy block 300 that degraded over time. As illustrated in FIG. 4, N is equal to four, and the poor block 400 includes eight zones 402A-402N. Each of the zones 402A-402N includes a respective stripe lengths 404A-404N for XOR parity data associated with their zones 402A-402N. In some examples, the respective stripe lengths 404A-404N are each 256 kilobytes (KB) in length, and the poor block 400 has a total of 2 megabytes (MB) in total stripe length (i.e., a "second collective stripe length"). Alternatively, in other examples, the respective stripe lengths 404A-404N may be decreased to 128 kilobytes (KB) in length, and the poor block 400 has a total of 1 megabytes (MB) in total stripe length. By decreasing the stripe length and increasing the number of zones, the dynamic stripe length manager circuit 188 may decrease recovery time while still increasing the total stripe length.

The dynamic stripe length manager circuit 188 may set blocks with very poor health (e.g., classified in bucket H1) to have stripe lengths of N*8, where 8 is a multiplication of the number of zones by eight. As explained above, the stripe length may be determined as a function of health of the block and the host protection level requested (i.e., the HPL may be included as part of the request 134) for the block by the host 150, and defined by the following expression.

$$\text{StripeLength} = fx(\text{BlockHealth}, \text{HostProtectionLevel}) \quad \text{Equation (3):}$$

The dynamic stripe length manager circuit 188 may determine a stripe length from a trigger in an idle window or when encountering soft read modes. Put simply, the rebalancing performed by the dynamic stripe length manager circuit 188 occurs while the memory controller 120 is idle or encountering soft read modes. A change in stripe length requires an increase in the number of zones, which initiates a change in Open Block size.

In some examples, the dynamic stripe length manager circuit 188 may implement a dynamic open block policy. The dynamic stripe length manager circuit 188 implements the dynamic open block policy to dictate the user space in a block based on the weighted health factor 186 that is associated with the block. The dynamic stripe length manager circuit 188 decides the user space in a block before allocation of block for fresh host write by the host 150. In some examples, the dynamic stripe length manager circuit 188 implements the dynamic open block policy with an open block and weighted health factor (OBWHF) map 192 to determine the open blocks that are required to follow a particular health policy.

Figures 5, 6:
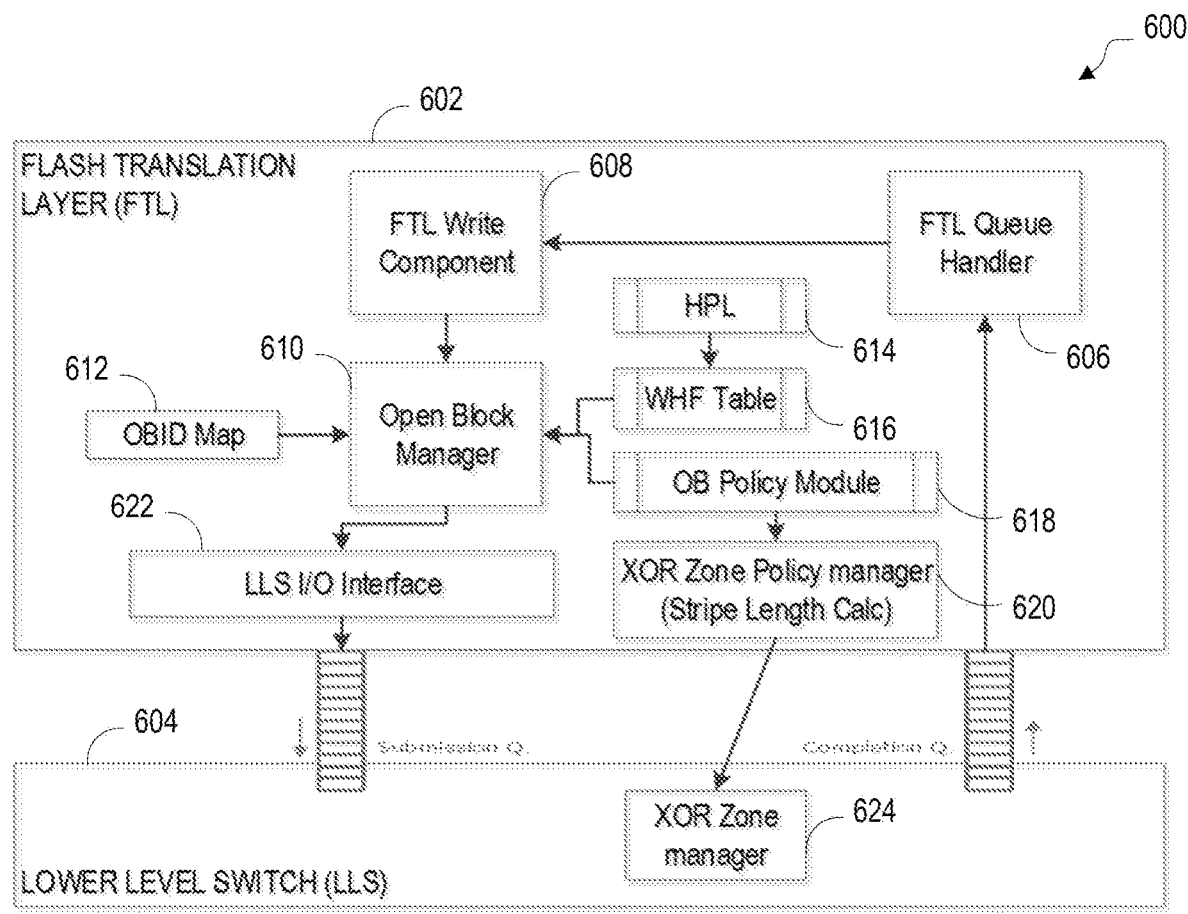
FIG. 5 is a block diagram illustrating an example of an open block weighted health factor (OBWHF) map of FIG. 1, in accordance with some embodiments of disclosure.
FIG. 6 is a block diagram illustrating a firmware design that implements dynamic stripe length, in accordance with some embodiments of the disclosure.

FIG. 5 is a block diagram illustrating an example of the OBWHF map 192 of FIG. 1, in accordance with some embodiments of disclosure. As illustrated in FIG. 5, the OBWHF map 192 includes a weighted health factor (WHF) column and an open block identifier (OBID) column. The WHF column has rows for each of the three buckets H1, H2, and H3 described above. The OBID column includes open block identifiers that separated into the rows established by the WHF column according to the health of the open blocks associated with the respective open block identifiers.

As illustrated in FIG. 5, the "very poor health" bucket H1 row includes OBIDs 10, 12, 113, and 114, which indicates that open blocks 10, 12, 113, and 114 are binned in bucket H1 and have "very poor health." Similarly, the "poor health" bucket H2 row includes OBIDs 89 and 90, which indicates that open blocks 89 and 90 are binned in bucket H2 and have "poor health." Further, the "good health" bucket H3 row includes OBIDs 0-9, 11, 13-88, and 91-112, which indicates that open blocks 0-9, 11, 13-88, and 91-112 are binned in bucket H3 and have "good health."

The OBWHF map 192 may be stored in the available memory regions 170. However, the OBWHF map 192 may also be stored in the memory 174, the health meter 180, or the dynamic stripe length manager circuit 188. Based on the OBWHF map 192, the dynamic stripe length manager circuit 188 determines the max open zones for a block thereby the stripe length of the block. Additionally, in some examples, the stripe length determination by dynamic stripe length manager circuit 188 may be based on the OBWHF map 192 and the host level protection requirement from the host 150. For example, where the host 150 directs the data storage device 102 for better data protection levels, the dynamic stripe length manager circuit 188 may modify the stripe ratio to account for the appropriate protection levels. For instance, the stripe length may be increased from N to N*4 or N*8 for blocks with good health, when the requested data protection level is a high data protection level. In this instance, blocks with "poor health" or "very poor health" may also have a corresponding 2× or 4× increase in their stripe lengths (e.g., N*8 or N*16 for "poor health" and N*16 or N*32 for "very poor health").

The ECC engine 194 may be configured to receive data, such as the user data 132, and to generate one or more error correction code (ECC) codewords (e.g., including a data portion and a parity portion) based on the data. For example, the ECC engine 194 may include an encoder configured to encode the data using an ECC encoding technique. The ECC engine 194 may include a Reed-Solomon encoder, a Bose-Chaudhuri-Hocquenghem (BCH) encoder, a low-density parity check (LDPC) encoder, a turbo encoder, an encoder configured to encode the data according to one or more other ECC techniques, or a combination thereof.

The ECC engine 194 may include a decoder configured to decode data read from the memory 104 to detect and correct bit errors that may be present in the data. For example, the ECC engine 194 may correct a number of bit errors up to an error correction capability of an ECC technique used by the ECC engine 194. A number of errors identified by the ECC engine 194 may be tracked by the controller 120, such as by the ECC engine 194. For example, based on the number of errors, the ECC engine 194 may determine a bit error rate (BER) associated with one or more regions of the memory 104.

During operation of the data storage device 102, the controller 120 may receive a request 134 from the host device to perform a memory operation 162. In some implementations, the controller 120 may generate a request to perform a memory operation associated with the memory 104. The memory operation 162 may include or correspond to a write operation, a read operation, a folding operation, a wear-leveling operation, a garbage collection operation, an erase operation, a combination thereof, or other suitable memory operation. For example, the memory operation 162 may include one or more sub-operations to be performed. In particular, a garbage collection operation may include a first sub-operation to read data from a particular region of the memory 104 and a second sub-operation to write data to an available region of the memory 104 identified based on information from the available memory regions 170.

During a write operation, data may be written to one or more storage elements. During a read operation, data may be read from one or more storage elements. During a folding operation, an internal transfer may occur at the memory 104 where data stored at single-level cell (SLC) pages is read and stored at one or more multi-level cell (MLC) pages. During a wear-leveling operation and/or a garbage collection operation, data may be transferred within the memory 104 for purposes of equalizing wear of different regions of the memory 104 and/or for gathering defragmented data into one or more consolidated regions of the memory 104. During an erase operation, data may be erased from one or more storage elements of the memory 104.

For dynamic stripe length, a run time mapping of zone length and open block is required. FIG. 6 is a block diagram illustrating a firmware design 600 that implements dynamic stripe length, in accordance with some embodiments of the disclosure. In the example of FIG. 6, the firmware design 600 includes a flash translation layer 602 and a lower level switching 604. The flash translation layer 602 includes a flash translation layer queue handler 606, a flash translation layer write component 608, an Open Block (OB) manager 610, an Open Block Identifier (OBID) map 612, a Host Protection Level (HPL) requirement 614, a Weighted Health Factor (WHF) table 616, an Open Block (OB) Policy Module 618, an XOR Zone Policy Manager 620, and a Lower Level Switch I/O interface 622. The lower level switch 604 includes an XOR Zone manager 624.

To arrive at the stripe length, on every fresh host write, the weighted health factor may be calculated for the block via inputs from the WHF table 616 and the HPL requirement 614, and the WHF that is calculated is then passed to the Open Block (OB) policy manager 610.

The OB policy module 618 communicates with the XOR zone policy manager 620 to arrive at the number of XOR zones for the given block. The zone count is passed from the XOR zone policy manager 620 in the flash translation layer 602 to the XOR zone manager 624 in the lower level switch 604 to handle the zone programming.

For the sake of uniform recovery time, the open block is divided into several open block chunks. Based on the WHF that is calculated, N zones may be created for M open block chunks where (N<=M). This mapping ($N_{zones}$, $M_{Chunks}$) is then stored in the OBID Map 612 for every host block.

In some examples, the OBID Map 612 may be recalculated on every fresh host write. The number of zones will determine the dynamic stripe length of an open block. The decision is dynamic and performed on fresh host writes.

Figure 7:
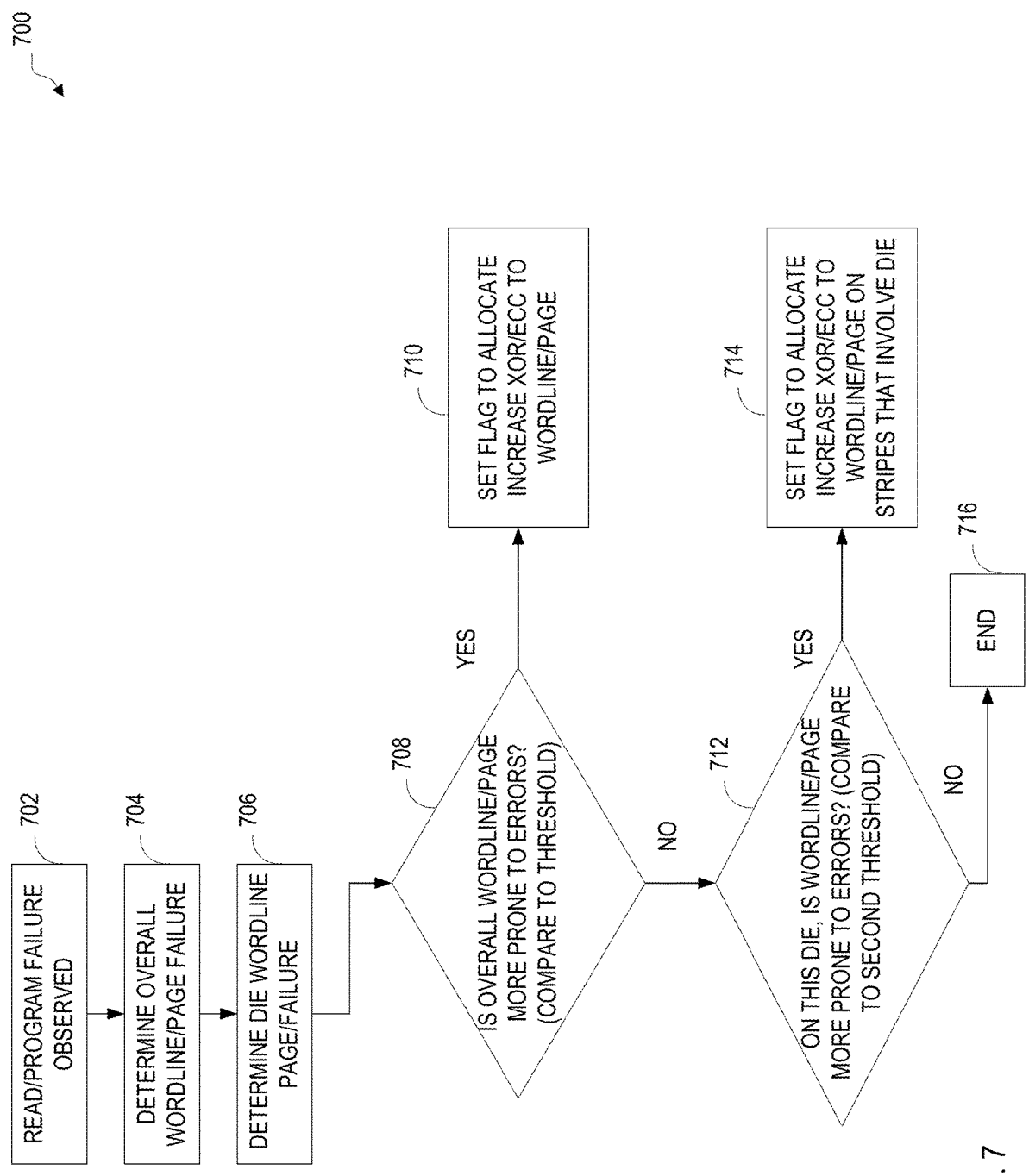
FIG. 7 is a flowchart illustrating another exemplary process for managing the dynamic stripe length, in accordance with some embodiments of the disclosure.

FIG. 7 is a flowchart illustrating another exemplary process 700 for managing the dynamic stripe length, in accordance with some embodiments of the disclosure. In the example of FIG. 7, the process 700 includes the memory controller 120 observing a read and/or program failure (at block 702). Upon observing the read and/or program failure, the dynamic stripe length manager circuit 188 determines an overall wordline/page failure (at block 704) and determines a die wordline/page failure (at block 706). The dynamic stripe length manager circuit 188 then determines whether the overall wordline/page is prone to more errors by comparing the number of errors to a threshold (at decision block 708). Prone to more errors may mean prone to more errors than a "typical" or "usual" memory block, where "typical" or "usual" may be determined and set by experiment, by a user, or any other number of ways that will be apparent to those of skill in the art. Alternatively, prone to more errors may mean that the memory block is prone to having more (i.e., additional) errors than at an earlier time. Responsive to determining that the overall wordline/page is prone to more errors ("YES" at decision block 708), i.e., the errors exceed the threshold, the dynamic stripe length manager circuit 188 sets a flag to allocate more XOR/ECC to the overall wordline/page (at block 710).

Responsive to determining that the overall wordline/page is not prone to more errors ("NO" at decision block 708), i.e., the errors do not exceed the threshold, the dynamic stripe length manager circuit 188 then determines whether, on this die, the wordline/page is prone to more errors by comparing the number of errors to a second threshold (at decision block 712). Responsive to determining that, on this die, the wordline/page is prone to more errors ("YES" at decision block 712), i.e., the errors exceed the second threshold, the dynamic stripe length manager circuit 188 sets a flag to allocate more XOR/ECC to other wordlines/pages on the die (at block 714). Responsive to determining that, on this die, the wordline/page is not prone to more errors ("No" at decision block 712), i.e., the dynamic stripe length manager 188 ends the process 700 (at block 716).

FIG. 8 is a flowchart illustrating another exemplary process 800 for managing the dynamic stripe length, in accordance with some embodiments of the disclosure. In the example of FIG. 8, the process 800 includes the memory controller 120 observing a successful read (at block 802). The dynamic stripe length manager circuit 188 then determines whether a number of reads exceeds a rebalancing threshold (at decision block 804). Responsive to determining that the number of reads exceed the rebalancing threshold ("YES" at decision block 804), the dynamic stripe length manager circuit 188 recalculates health buckets for all wordlines (at block 806). Responsive to determining that the number of reads do not exceed the rebalancing threshold ("NO" at decision block 804) or after recalculating the health buckets for all the wordlines, the dynamic stripe length manager 188 ends the process 800 (at block 808).

FIG. 9 is a flowchart illustrating another exemplary process 900 for managing the dynamic stripe length, in accordance with some embodiments of the disclosure. In the example of FIG. 9, the process 00 includes the memory controller 120 observing a read and/or program failure (at block 902). Upon observing the read and/or program failure, the dynamic stripe length manager circuit 188 determines an overall wordline/page failure (at block 004). The dynamic stripe length manager circuit 188 then determines whether the overall wordline/page is prone to more errors by comparing the number of errors to a threshold (at decision block 906). Responsive to determining that the overall wordline/page is prone to more errors ("YES" at decision block 906), i.e., the errors exceed the threshold, the dynamic stripe length manager circuit 188 sets a flag to allocate more XOR/ECC to the location of the wordline/page (at block 908). Responsive to determining that the overall wordline/page is prone to more errors ("NO" at decision block 906) or setting a flag to allocate more XOR/ECC to the location of the wordline/page, the dynamic stripe length manager 188 ends the process 900 (at block 910).

Figure 10:
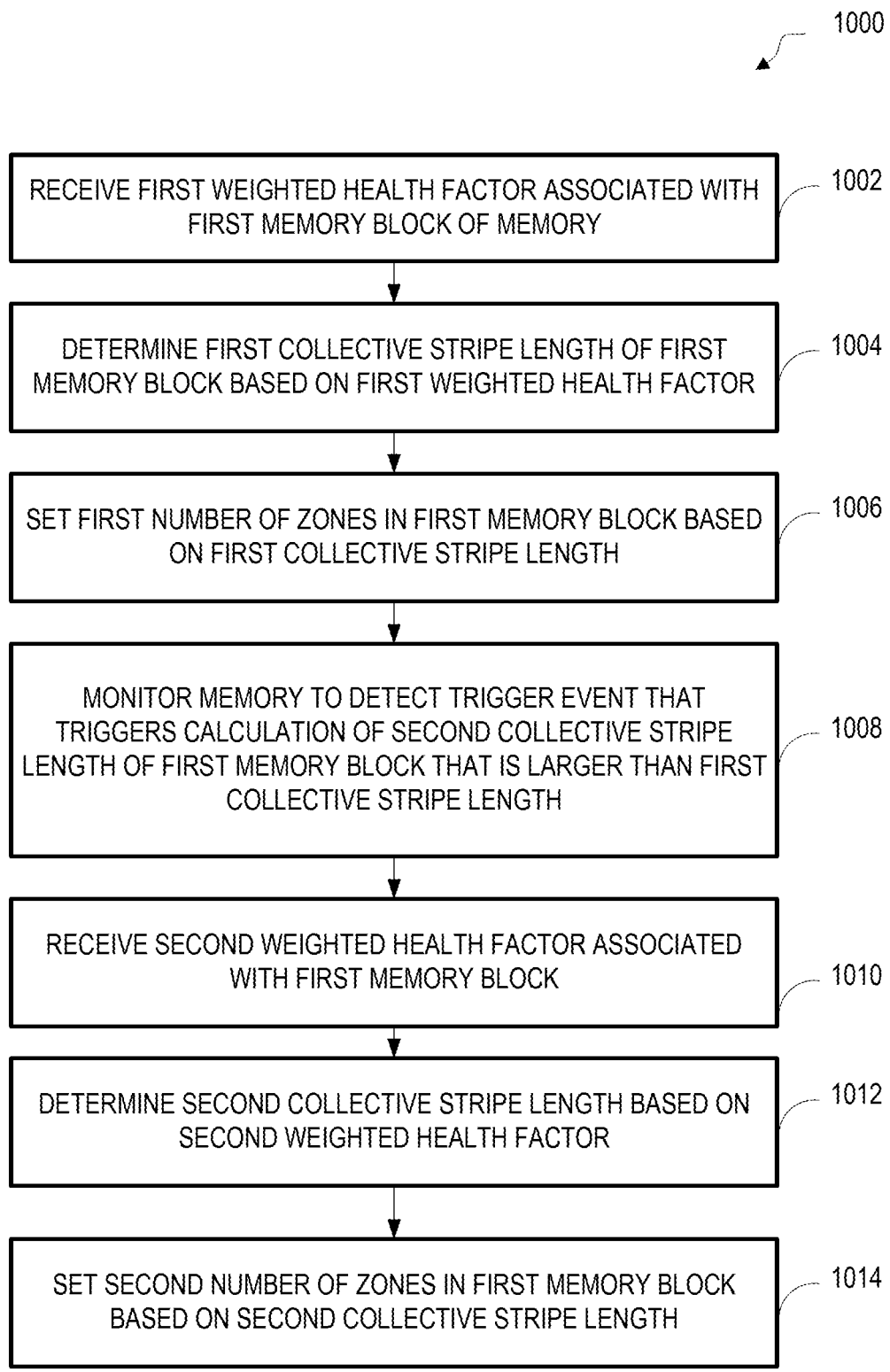
FIG. 10 is a flowchart illustrating an exemplary process for dynamically determining a stripe length for a first memory block, in accordance with some embodiments of the disclosure.

FIG. 10 is a flowchart illustrating an exemplary process 1000 for determining a stripe length for a first memory block, in accordance with some embodiments of the disclosure. FIG. 10 is described with respect to FIG. 1.

In the example of FIG. 10, the process 1000 includes receiving, with the dynamic stripe length manager circuit 188, a first weighted health factor (first instance of WHF) associated with a first memory block of a memory (at block 1002). The process 1000 includes determining, with the dynamic stripe length manager circuit 188, a first collective stripe length of the first memory block based on the first weighted health factor (at block 1004). The process 1000 includes setting, with the dynamic stripe length manager circuit 188, a first number of zones (e.g., N equal to 2) in the first memory block based on the first collective stripe length (at block 1006). The process includes monitoring, with the dynamic stripe length manager circuit 188, the memory to detect a trigger event that triggers a calculation of a second collective stripe length of the first memory block, the second collective stripe length being larger than the first collective stripe length (at block 1008). The process 1000 includes receiving, with the dynamic stripe length manager circuit 188, a second weighted health factor (second instance of WHF) associated with the first memory block (at block 1010). The process 1000 includes determining, with the dynamic stripe length manager circuit 188, the second collective stripe length based on the second weighted health factor (at block 1012). The process 1000 also includes setting, with the dynamic stripe length manager circuit 188, a second number of zones (e.g., N*4) in the first memory block based on the second collective stripe length (at block 1014).

In some examples, the process 1000 may further include receiving a first host protection level requirement and receiving a second host protection level requirement. The first collective stripe length may be determined based on the first weighted health factor and the first host protection level requirement. The second collective stripe length may be determined based on the second weighted health factor and the second host protection level requirement.

Additionally, in some examples, the process 1000 further includes setting a first size of respective stripe lengths in the first memory block based on the first collective stripe length and setting a second size of second respective stripe lengths in the first memory block based on the second collective stripe length. In these examples, the first size may be larger than the second size.

In some examples, monitoring the memory to detect the trigger event that triggers the calculation of the second collective stripe length of the first memory block may further include determining an idle window before a host write to the first memory block, and calculating the second collective stripe length of the first memory block during the idle window.

Alternatively, in some examples, monitoring the memory to detect the trigger event that triggers the calculation of the second collective stripe length of the first memory block may further include, after a successful a read operation of the first memory block, determining whether a number of read operations since the determination of the first collective stripe length exceeds a rebalancing threshold, and calculating the second collective stripe length of the first memory block in response to the determining that the number of read operations since the determination of the first collective stripe length exceeds the rebalancing threshold.

Additionally, in some examples, monitoring the memory to detect the trigger event that triggers the calculation of the second collective stripe length of the first memory block may further include receiving an indication of an observed read/program failure at the first memory block, determining an overall wordline/page failure of the first memory block in response to receiving the indication, determining whether the overall wordline/page is prone to more errors by comparing the overall wordline/page failure to a threshold, and setting a flag to allocate an increase in XOR/ECC to the wordlines/pages that are prone to more errors.

In these examples, the process 1000 may further include determining a die wordline/page failure in response to determining the overall wordline/page failure, determining, with respect to the die, whether the overall wordline/page is prone to more errors by comparing the overall wordline/page failure to a second threshold, and setting a flag to allocate an increase in XOR/ECC to other wordlines/pages on the die.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The Abstract is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A memory controller, comprising:
    a memory interface configured to interface with a memory; and
    a dynamic stripe length manager circuit configured to:
        receive a first weighted health factor associated with a first memory block of the memory,
        determine a first collective stripe length of the first memory block based on the first weighted health factor,
        set a first number of zones in the first memory block based on the first collective stripe length,
        monitor the memory to detect a trigger event that triggers a calculation of a second collective stripe length of the first memory block, the second collective stripe length being larger than the first collective stripe length,
        receive a second weighted health factor associated with the first memory block,
        determine the second collective stripe length based on the second weighted health factor, and
        set a second number of zones in the first memory block based on the second collective stripe length.

2. The memory controller of claim 1, wherein the first collective stripe length is determined based on the first weighted health factor and a first host protection level requirement, and wherein the second collective stripe length is determined based on the second weighted health factor and a second host protection level requirement.

3. The memory controller of claim 1, wherein the dynamic stripe length manager circuit is further configured to
    set a first size of respective stripe lengths in the first memory block based on the first collective stripe length, and
    set a second size of second respective stripe lengths in the first memory block based on the second collective stripe length.

4. The memory controller of claim 3, wherein the first size is larger than the second size.

5. The memory controller of claim 1, wherein, to monitor the memory to detect the trigger event, the dynamic stripe length manager circuit is further configured to:
    determine an idle window before a host write to the first memory block, and calculate the second collective stripe length of the first memory block during the idle window.

6. The memory controller of claim 1, wherein, to monitor the memory to detect the trigger event, the dynamic stripe length manager circuit is further configured to, after a successful read operation of the first memory block:
 determine whether a number of read operations since the determination of the first collective stripe length exceeds a rebalancing threshold, and
 calculate the second collective stripe length of the first memory block in response to the determining that the number of read operations since the determination of the first collective stripe length exceeds the rebalancing threshold.

7. The memory controller of claim 1, wherein, to monitor the memory to detect the trigger event, the dynamic stripe length manager circuit is further configured to:
 receive an indication of an observed read/program failure at the first memory block,
 determine an overall wordline/page failure of the first memory block in response to receiving the indication,
 determine whether the overall wordline/page is prone to more errors by comparing the overall wordline/page failure to a threshold, and
 set a flag to allocate an increase in XOR/ECC to the wordlines/pages that are prone to more errors.

8. The memory controller of claim 7, wherein the dynamic stripe length manager circuit is further configured to:
 determine a die wordline/page failure in response to determining the overall wordline/page failure,
 determine, with respect to the die, whether the overall wordline/page is prone to more errors by comparing the overall wordline/page failure to a second threshold, and
 sets a flag to allocate an increase in XOR/ECC to other wordlines/pages on the die.

9. A method, comprising:
 receiving, with a dynamic stripe length manager circuit, a first weighted health factor associated with a first memory block of a memory;
 determining, with the dynamic stripe length manager circuit, a first collective stripe length of the first memory block based on the first weighted health factor;
 setting, with the dynamic stripe length manager circuit, a first number of zones in the first memory block based on the first collective stripe length;
 monitoring, with the dynamic stripe length manager circuit, the memory to detect a trigger event that triggers a calculation of a second collective stripe length of the first memory block, the second collective stripe length being larger than the first collective stripe length;
 receiving, with the dynamic stripe length manager circuit, a second weighted health factor associated with the first memory block;
 determining, with the dynamic stripe length manager circuit, the second collective stripe length based on the second weighted health factor; and
 setting, with the dynamic stripe length manager circuit, a second number of zones in the first memory block based on the second collective stripe length.

10. The method of claim 9, further comprising:
 receiving a first host protection level requirement; and
 receiving a second host protection level requirement,
 wherein the first collective stripe length is determined based on the first weighted health factor and the first host protection level requirement, and the second collective stripe length is determined based on the second weighted health factor and the second host protection level requirement.

11. The method of claim 9, further comprising:
 setting a first size of respective stripe lengths in the first memory block based on the first collective stripe length; and
 setting a second size of second respective stripe lengths in the first memory block based on the second collective stripe length.

12. The method of claim 11, wherein the first size is larger than the second size.

13. The method of claim 9, wherein monitoring the memory to detect the trigger event further includes:
 determining an idle window before a host write to the first memory block, and
 calculating the second collective stripe length of the first memory block during the idle window.

14. The method of claim 9, wherein monitoring the memory to detect the trigger event further includes:
 determining a successful a read operation of the first memory block,
 determining whether a number of read operations since the determination of the first collective stripe length exceeds a rebalancing threshold, and
 calculating the second collective stripe length of the first memory block in response to the determining that the number of read operations since the determination of the first collective stripe length exceeds the rebalancing threshold.

15. The method of claim 9, wherein monitoring the memory to detect the trigger event further includes:
 receiving an indication of an observed read/program failure at the first memory block,
 determining an overall wordline/page failure of the first memory block in response to receiving the indication,
 determining whether the overall wordline/page is prone to more errors by comparing the overall wordline/page failure to a threshold, and
 setting a flag to allocate an increase in XOR/ECC to the wordlines/pages that are prone to more errors.

16. The method of claim 15, further comprising:
 determining a die wordline/page failure in response to determining the overall wordline/page failure,
 determining, with respect to the die, whether the overall wordline/page is prone to more errors by comparing the overall wordline/page failure to a second threshold, and
 setting a flag to allocate an increase in XOR/ECC to other wordlines/pages on the die.

17. An apparatus, comprising:
 means for interfacing with a memory;
 means for receiving a first weighted health factor associated with a first memory block of the memory,
 means for determining a first collective stripe length of the first memory block based on the first weighted health factor,
 means for setting a first number of zones in the first memory block based on the first collective stripe length,
 means for monitoring the memory to detect a trigger event that triggers a calculation of a second collective stripe length of the first memory block, the second collective stripe length being larger than the first collective stripe length,
 means for receiving a second weighted health factor associated with the first memory block, means for determining the second collective stripe length based on the second weighted health factor, and means for setting a second number of zones in the first memory block based on the second collective stripe length.

18. The apparatus of claim 17, further comprising:

means for receiving a first host protection level requirement; and means for receiving a second host protection level requirement, wherein the first collective stripe length is determined based on the first weighted health factor and the first host protection level requirement, and wherein the second collective stripe length is determined based on the second weighted health factor and the second host protection level requirement.

19. The apparatus of claim 17, further comprising:

means for setting a first size of respective stripe lengths in the first memory block based on the first collective stripe length; and means for setting a second size of second respective stripe lengths in the first memory block based on the second collective stripe length.

20. The apparatus of claim 19, wherein the first size is larger than the second size.

* * * * *